United States Patent
Lee et al.

(10) Patent No.: US 11,776,791 B2
(45) Date of Patent: Oct. 3, 2023

(54) SUBSTRATE PROCESSING APPARATUS AND SUBSTRATE PROCESSING METHOD

(71) Applicant: PSK INC., Gyeonggi-do (KR)

(72) Inventors: Jong Chan Lee, Gyeonggi-do (KR); Geon Jong Kim, Gyeonggi-do (KR); Kwang Sung Yoo, Gyeonggi-do (KR); Seok June Yun, Gyeonggi-do (KR)

(73) Assignee: PSK INC., Gyeonggi-Do (KR)

( * ) Notice: Subject to any disclaimer, the term of this patent is extended or adjusted under 35 U.S.C. 154(b) by 179 days.

(21) Appl. No.: 16/886,543

(22) Filed: May 28, 2020

(65) Prior Publication Data

US 2021/0241997 A1    Aug. 5, 2021

(30) Foreign Application Priority Data

Feb. 4, 2020    (KR) .................. 10-2020-0013296

(51) Int. Cl.
*H01J 37/32* (2006.01)
*H01L 21/687* (2006.01)
*H05H 1/46* (2006.01)

(52) U.S. Cl.
CPC .. *H01J 37/32385* (2013.01); *H01J 37/32449* (2013.01); *H01J 37/32541* (2013.01); *H01L 21/687* (2013.01); *H05H 1/46* (2013.01)

(58) Field of Classification Search
CPC .......... H01J 37/32385; H01J 37/32449; H01J 37/32541; H01J 37/32532; H01J 37/32715; H01J 2237/334; H01J 37/32623; H01L 21/687; H01L 21/67109; H01L 21/3065; H01L 21/67069; H05H 1/46
See application file for complete search history.

(56) References Cited

U.S. PATENT DOCUMENTS

| | | | |
|---|---|---|---|
| 7,938,931 B2 | 5/2011 | Sexton et al. | |
| 11,302,558 B2* | 4/2022 | Lee | H01L 21/68742 |
| 2004/0238488 A1 | 12/2004 | Choi et al. | |
| 2006/0086461 A1 | 4/2006 | Inada et al. | |
| 2007/0181255 A1 | 8/2007 | Hayasaka et al. | |
| 2008/0179297 A1* | 7/2008 | Bailey | H01J 37/32568 |
| | | | 219/69.15 |
| 2008/0182412 A1* | 7/2008 | Bailey, III | H01L 21/0209 |
| | | | 156/345.43 |

(Continued)

FOREIGN PATENT DOCUMENTS

| | | | |
|---|---|---|---|
| JP | 2005005701 A | 1/2005 | |
| JP | 2010517296 A | 5/2010 | |

(Continued)

OTHER PUBLICATIONS

Office Action for related Taiwanese Patent Application No. 11020029010 dated Jan. 11, 2021, 9 pages.

(Continued)

*Primary Examiner* — Jeffrie R Lund
(74) *Attorney, Agent, or Firm* — Procopio, Cory, Hargreaves & Savitch LLP

(57) ABSTRACT

A substrate processing apparatus are provided. The substrate processing apparatus allows a supply flow rate per unit time for process gas supplied to the central area of a substrate to be greater than a supply flow rate per unit time for process gas supplied to an edge area of the substrate, when processing the edge area of the substrate supported by the chuck.

3 Claims, 6 Drawing Sheets

(56) References Cited

U.S. PATENT DOCUMENTS

| | | | |
|---|---|---|---|
| 2015/0020848 A1 | 1/2015 | Kim et al. | |
| 2015/0318150 A1 | 11/2015 | Fischer | |
| 2017/0207099 A1 | 7/2017 | Ohtake et al. | |
| 2020/0090968 A1* | 3/2020 | Van Selow | H01L 21/67109 |
| 2021/0241997 A1* | 8/2021 | Lee | H01J 37/32449 |
| 2021/0305014 A1* | 9/2021 | Kim | H01L 21/67109 |
| 2022/0059324 A1* | 2/2022 | Lee | H01J 37/32715 |
| 2023/0087660 A1* | 3/2023 | Ishikawa | H01J 37/32724 156/345.51 |
| 2023/0090650 A1* | 3/2023 | Ishikawa | H01L 21/6831 156/345.34 |

FOREIGN PATENT DOCUMENTS

| | | | |
|---|---|---|---|
| JP | 2010517297 A | | 5/2010 |
| JP | 2010518635 A | | 5/2010 |
| JP | 2010524225 A | | 7/2010 |
| JP | 2011029562 A | | 2/2011 |
| JP | 2012512542 A | | 5/2012 |
| JP | 2013145884 A | | 7/2013 |
| JP | 5309164 B2 | | 10/2013 |
| JP | 2013243388 A | | 12/2013 |
| KR | 10-2004-0102300 A | | 12/2004 |
| KR | 10-2004-0102300 A | | 5/2006 |
| KR | 10-0697043 B1 | | 3/2007 |
| KR | 100697043 B1 | | 3/2007 |
| KR | 10-2008-0032163 A | | 4/2008 |
| KR | 10-2008-0098985 A | | 11/2008 |
| KR | 20090085774 A | | 8/2009 |
| KR | 20100069010 A | | 6/2010 |
| KR | 20100138923 A | * | 12/2010 |
| KR | 20100138923 A | * | 12/2010 |
| KR | 10-2008-0098985 A | | 12/2013 |
| KR | 10-20080032163 A | | 8/2014 |
| TW | 201306122 A | * | 2/2013 |
| TW | I576908 B | * | 1/2017 |
| TW | 202209552 A | * | 3/2022 |
| TW | 202209552 A | * | 3/2022 ......... H01J 37/3244 |

OTHER PUBLICATIONS

Search report for related Korean Patent Application No. 10-2020-0013296 dated Feb. 25, 2020, 6 pages.
Office Action for related Korean Patent Application No. 10-2020-0013296 dated May 1, 2020 (5 pages).
Notice of Allowance for related Korean Patent Application No. 10-2020-0013296 dated May 13, 2020 (5 pages).
Search Report dated Mar. 9, 2021 in corresponding Singapore Patent Application No. 10202004597P, 5 pages.

* cited by examiner

SUBSTRATE PROCESSING APPARATUS AND SUBSTRATE PROCESSING METHOD

CROSS-REFERENCE TO RELATED APPLICATIONS

A claim for priority under 35 U.S.C. § 119 is made to Korean Patent Application No. 10-2020-0013296 filed on Feb. 4, 2020, in the Korean Intellectual Property Office, the entire contents of which are hereby incorporated by reference.

BACKGROUND

Embodiments of the inventive concept described herein relate to a substrate processing apparatus and a substrate processing method. More particularly, embodiments of the inventive concept described herein relate to a substrate processing apparatus and a substrate processing method, capable of processing a substrate using plasma.

Plasma refers to the state of an ionized gas including ions, radicals, and electrons, and is generated by very high temperatures, strong electric fields, or RF electromagnetic fields. A process of fabricating a semiconductor device includes an ashing or etching process to remove a film from a substrate using plasma. The ashing or etching process is performed as ions or radical particles contained in the plasma collide or react with the film on the substrate. The process of processing a substrate using plasma is performed through various manners. Among them, a bevel etching device to process an edge area of the substrate is to process the edge area of the substrate by supplying plasma to the edge area of the substrate or generating the plasma on the edge area of the substrate.

FIG. 1 is a view illustrating a typical bevel etching device to perform a bevel etching process. Referring to FIG. 1, the typical bevel etching device 1000 includes a chuck 1100, an insulating ring 1200, a lower electrode 1300, a dielectric plate 1400, and an upper electrode 1500. The chuck 1100 has a seating surface on which the substrate 'W' is seated, and is connected to a power source 1110. The insulating ring 1200 is provided to surround the chuck 1100 when viewed from the top. In addition, the lower electrode 1300 is provided in a shape to surround the insulating ring 1200 when viewed from the top. The insulating ring 1200 is provided between the lower electrode 1300 and the chuck 1100 to separate the lower electrode 1300 and the chuck 1100 from each other. The dielectric plate 1400 is disposed to face the top surface of the substrate 'W' supported by the chuck 1100. In addition, an outlet, through which the inert gas GA is discharged, is formed in the central area of the dielectric plate 1400. The upper electrode 1500 is disposed to face lower electrode 1300 and is provided to be spaced apart from the dielectric plate 1400. The space between the dielectric plate 1400 and the upper electrode 1500 may serve as an outlet to discharge the process gas GB.

When the edge area of the substrate 'W' is processed in the typical bevel etching apparatus 1000, the inert gas GA is discharged through the outlet formed in the dielectric plate 1400, and the process gas GB is discharged through the space between the dielectric plate 1400 and the upper electrode 1500. The inert gas GA is supplied to the central area of the top surface of the substrate 'W', and the process gas GB is supplied to the edge area of the top surface of the substrate 'W'. The process gas GB supplied to the edge area of the top surface of the substrate 'W' is excited to be in the state of the plasma P due to the electromagnetic field generated from the upper electrode 1500 and the lower electrode 1300. In addition, the inert gas GA supplied to the central area of the top surface of the substrate 'W' flows toward the edge area of the substrate 'W' from the central area of the substrate 'W'. Accordingly, the introducing of the process gas GB toward the central area of the substrate 'W' is prevented. In other words, the typical bevel etching device 1000 supplies the inert gas GA to the central area of the substrate 'W', such that the plasma P is generated from the edge area of the substrate 'W'.

The typical bevel etching device 1000 supplies the inert gas GA to the central area of the substrate 'W' as described above. Accordingly, the process gas GB supplied to the edge area of the substrate 'W' is prevented from being introduced into the central area of the substrate 'W'. However, the bevel etching process performed by the typical bevel etching device 1000 has a limitation in uniformly processing the edge area of the substrate 'W'. Specifically, in the bevel etching process performed by the typical bevel etch device 1000, the ratio of the process gas GB per unit volume in the area, where the process gas GB and the inert gas GA meet, is different from the ratio of the process gas GB per unit volume in other areas. This is because the ratio of the process gas GB per unit volume is lowered, as the inert gas GA is mixed with the process gas GB in the area where the process gas GB and the inert gas GA meet. When the ratio of the process gas GB per unit volume is changed, the processing of the plasma with respect to the edge area of the substrate 'W' is lowered.

In addition, the typical bevel etching device 1000 has a limitation in improving the etch rate (E/R). When the supply flow rate per unit time is increased for the process gas GB supplied to the edge area of the substrate 'W' to increase the etch rate (E/R), the process gas GB is introduced into the central area of the substrate 'W'. The area, where the process gas GB and the inert gas GA meet, is closer to the central area of the substrate 'W'. The area, where the mixing ratio between the process gas GB and the inert gas GA is different, is more expanded in a radial direction of the substrate 'W'. Accordingly, the uniformity for processing the substrate 'W' may be more degraded. When the supply flow rate of the process gas GB unit time is reduced to solve the above problem, the etch rate (E/R) for the edge area of the substrate 'W' may be lowered.

SUMMARY

Embodiments of the inventive concept provide a substrate processing apparatus and a substrate processing method, capable of efficiently processing a substrate.

Embodiments of the inventive concept provide a substrate processing apparatus and a substrate processing method, capable of uniformly performing a plasma process for a substrate.

Embodiments of the inventive concept provide a substrate processing apparatus and a substrate processing method, capable of enhancing the efficiency of plasma process for an edge area of a substrate.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, a substrate processing apparatus is provided. The substrate processing apparatus may include a housing having a process space, a support unit configured to support a substrate in the process space, a gas supply unit to supply process gas to the process space, a dielectric plate disposed to face the substrate supported by the support unit in the process space, an upper electrode spaced apart from the dielectric plate while surrounding the dielectric plate when viewed from atop, and a controller. The support unit may include a chuck having a support surface to support the substrate and connected with a power source, and a lower electrode disposed to face the upper electrode while surrounding the chuck when viewed from a top. The gas supply unit may include a first gas supply part configured to supply the process gas to a central area of the substrate supported by the chuck, and a second gas supply part configured to supply the process gas through a space between the dielectric plate and the upper electrode which are provided on an edge area of the substrate supported by the chuck. The controller may control the gas supply unit such that a supply flow rate per unit time for the process gas supplied from the first gas supply part is greater than a supply flow rate per unit time for the process gas supplied from the second gas supply part when processing the edge area of the substrate supported by the chuck.

According to an embodiment, the controller may control the gas supply unit such that only the first gas supply part supplies the process gas, when processing the edge area of the substrate supported by the chuck.

According to an embodiment, the support unit, the dielectric plate, and the upper electrode may be provided, such that a volume of a space, in which the process gas supplied by the gas supply unit flows, is larger in the edge area of the substrate supported by the chuck than the central area of the substrate supported by the chuck, when viewed from the top.

According to an embodiment, the support unit further may include an insulating ring interposed between the chuck and the lower electrode.

According to an embodiment, the insulating ring and the lower electrode may be spaced apart from a bottom surface of the edge area of the substrate supported by the chuck.

According to an embodiment, a molecular weight of the process gas supplied from the first gas supply part may be equal to a molecular weight of the process gas supplied from the second gas supply part.

According to an embodiment, the controller may control the support unit and the gas supply unit such that the power source applies power to the chuck to generate plasma at the edge area of the substrate supported by the chuck when the first gas supply part and/or the second gas supply part supplies the process gas.

According to an exemplary embodiment, a method for processing a substrate is provided. The method may include processing the edge area of the substrate supported by the chuck by supplying plasma. The supply flow rate unit time for the process gas supplied to the central area of the substrate may be greater than the supply flow rate unit time for the process gas supplied to the edge area of the substrate, when the edge area of the substrate is processed.

According to an embodiment, the process gas may be supplied only to the central area of the substrate, when the edge area of the substrate is processed.

According to an exemplary embodiment, a substrate processing apparatus is provided. The substrate process apparatus may include a housing having a process space, a support unit to support a substrate in the process space, a gas supply unit to supply process gas to the process space, a dielectric plate disposed to face the substrate supported by the support unit in the process space, an upper electrode spaced apart from the dielectric plate while surrounding the dielectric plate when viewed from a top, and a controller. The support unit may further include a chuck having a support surface to support the substrate and connected with a power source, and a lower electrode disposed to face the upper electrode while surrounding the chuck when viewed from the top. The gas supply unit may include a first gas supply part configured to the supply process gas to a central area of the substrate supported by the chuck. The support unit, the dielectric plate, and the upper electrode may be provided, such that a volume of a space, in which the process gas supplied by the gas supply unit flows, is larger in the edge area of the substrate supported by the chuck than the central area of the substrate supported by the chuck, when viewed from the top. The controller may control the gas supply unit such that only the first gas supply part supplies the process gas, when processing the edge area of the substrate supported by the chuck.

According to an embodiment, the gas supply unit may include a second gas supply part configured to the supply process gas through a space between the dielectric plate and the upper electrode which are provided on the edge area of the substrate supported by the chuck, and the controller may control the gas supply unit such that a total molecular weight per unit time for the process gas supplied from the first gas supply part is greater than a total molecular weight per unit time for the process gas supplied from the second gas supply part, when processing the edge area of the substrate supported by the chuck.

According to an embodiment, the support unit may further include an insulating ring interposed between the chuck and the lower electrode.

According to an embodiment, the insulating ring and the lower electrode may be spaced apart from a bottom surface of the edge area of the substrate supported by the chuck.

According to an embodiment, the controller may control the support unit and the gas supply unit such that the power source applies power to the chuck to generate plasma at the edge area of the substrate supported by the chuck when the first gas supply part and/or the second gas supply part supplies the process gas.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
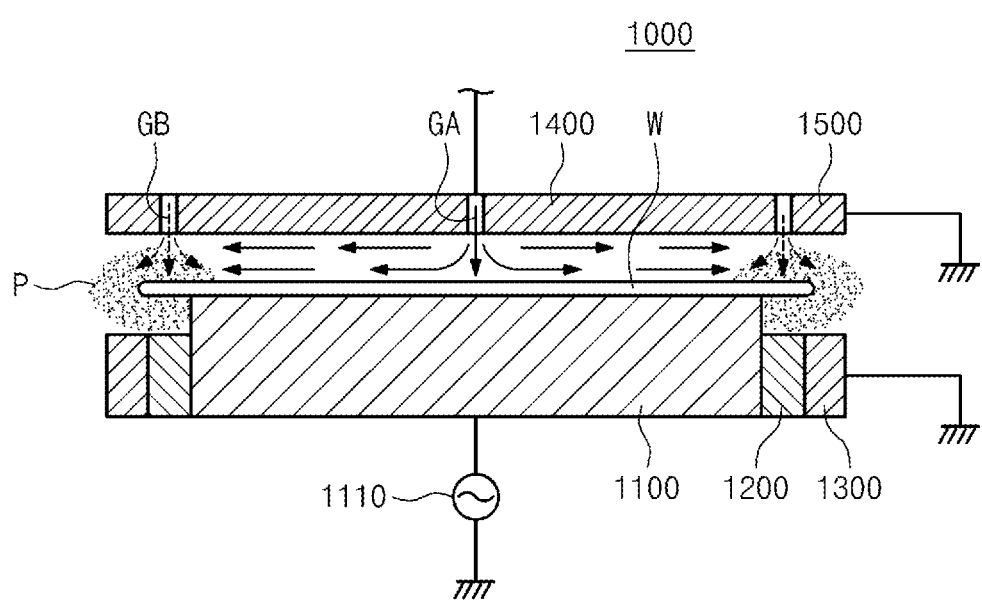
FIG. 1 is a view illustrating a typical bevel etching device to perform a bevel etching process.

Hereinafter, the embodiment of the inventive concept will be described in detail with reference to accompanying drawings to allow those skilled in the art to easily reproduce the inventive concept. However, the inventive concept may be implemented in various forms, and is limited to embodiments described herein. In addition, in the following detailed description of the inventive concept, a detailed description of well-known art or functions will be ruled out in order not to unnecessarily obscure the gist of the inventive concept. In addition, parts performing similar functions and similar operations will be assigned with the same reference numerals throughout the drawings When a certain part "includes" a certain component, the certain part does not exclude other components, but may further include other components if there is a specific opposite description. In detail, it will be further understood that the terms "comprises," "comprising," "includes," or"including," or "having" specify the presence of stated features, numbers, steps, operations, components, parts, or the combination thereof, but do not preclude the presence or addition of one or more other features, numbers, steps, operations, components, components, and/or the combination thereof.

The singular forms are intended to include the plural forms unless the context clearly indicates otherwise. In addition, the shapes and the sizes of components in accompanying drawings will be exaggerated for more apparent description.

Hereinafter, the embodiments of the inventive concept will be described in detail with reference to FIGS. 2 to 7.

Figure 2:
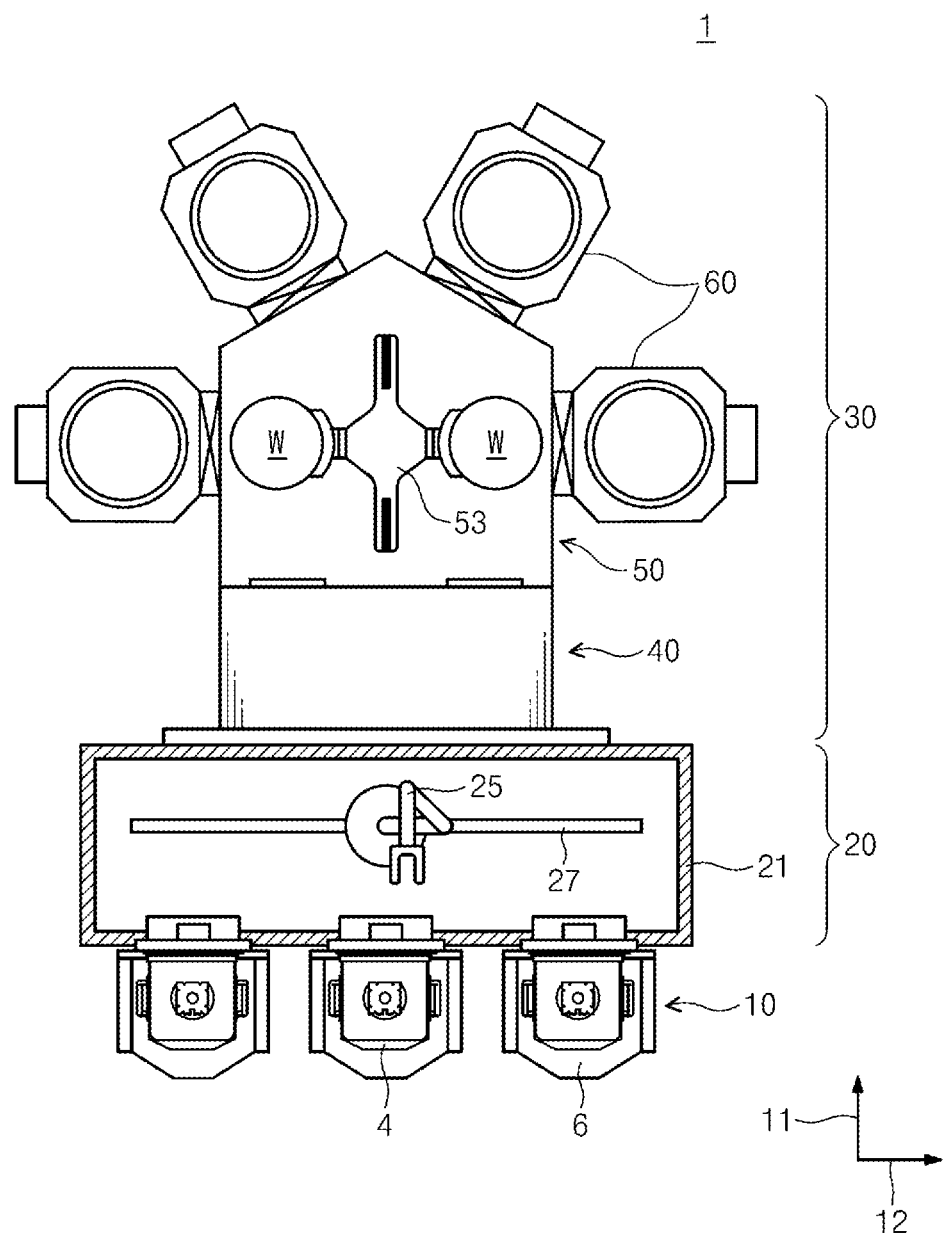
FIG. 2 is a view schematically illustrating a substrate processing equipment, according to an embodiment of the inventive concept.

FIG. 2 is a view schematically illustrating a substrate processing equipment, according to an embodiment of the inventive concept. Referring to FIG. 2, a substrate processing equipment 1 has an equipment front end module (EFEM) 20 and a processing module 30. The EFEM 20 and the processing module 30 are disposed in one direction.

The EFEM 20 has a load port 10 and a transfer frame 21. The load port 10 is disposed in a front end portion of the EFEM 20 in a first direction 11. The load port 10 has a plurality of support parts 6. The support parts 6 are aligned in line with each other in a second direction 12, and a carrier 4 (for example, a cassette, or FOUP), in which a substrate 'W' to be provided for a process or a substrate 'W' having completely processed are received, is seated on the support part 6. The carrier 4 receives the substrate 'W' to be provided for a process or the substrate 'W' having completely processed. The transfer frame 21 is interposed between the load port 10 and the processing module 30. The transfer frame 21 includes a first transfer robot 25 disposed inside the transfer frame 21 to transfer the substrate 'W' between the load port 10 and the processing module 30. The first transfer robot 25 moves along a transfer rail 27 extending in the second direction 12 to transfer the substrate 'W' between the carrier 4 and the processing module 30.

The processing module 30 includes a load lock chamber 40, a transfer chamber 50, and a process chamber 60. The processing module 30 may receive the substrate 'W' from the EFEM 20 to process the substrate 'W'.

The load lock chamber 40 is disposed to be adjacent to the transfer frame 21. For example, the load lock chamber 40 may be interposed between the transfer chamber 50 and the EFEM 20. The load lock chamber 40 provides a space in which the substrate 'W' to be provided for the process stands by before the substrate 'W' is transferred to the process chamber 60, or the substrate 'W' having completely processed stands by before the substrate 'W' is transferred to the EFEM 20.

The transfer chamber 50 may carry the substrate 'W'. The transfer chamber 50 is disposed to be adjacent to the load lock chamber 40. The transfer chamber 50 has a body in a polygonal shape when viewed from the top. Referring to FIG. 2, the transfer chamber 50 has a body in a pentagonal shape when viewed from the top. A load lock chamber 40 and a plurality of process chambers 60 are disposed outside the body and arranged along the circumference of the body. A passage (not illustrated), which is formed through each sidewall of the body to allow the substrate 'W' to enter and exit, connects the transfer chamber 50 with the load lock chamber 40 or connects the transfer chamber 50 with the process chambers 60. A door (not illustrated) is provided at each passage to close or open the passage such that an inner part of the body is sealed. A second transfer robot 53 is disposed in an inner space of the transfer chamber 50 to transfer the substrate 'W' between the load lock chamber 40 and the process chambers 60. The second transfer robot 53 transfers a substrate 'W', which is unprocessed and stands by in the load lock chamber 40, to the process chamber 60, or transfers the substrate 'W', which has completely processed, to the load lock chamber 40. In addition, the second transfer robot 53 transfers the substrate 'W' between the process chambers 60 to sequentially provide the substrate 'W' to the plurality of process chambers 60. As illustrated in FIG. 2, when the transfer chamber 50 has the polygonal body, the load lock chamber 40 is disposed on a sidewall, which is closer to the EFEM 20, of the transfer chamber 50 and the process chambers 60 are sequentially disposed on remaining sidewalls of the transfer chamber 50. The transfer chamber 50 may be provided in various shapes depending on required process modules, as well as the above shape.

The process chamber 60 may be disposed to be closer to the transfer chamber 50. The process chambers 60 are arranged along the circumference of the transfer chamber 50. A plurality of process chambers 60 may be provided. In each process chamber 60, the processing for the substrate 'W' may be performed. The process chamber 60 receives the substrate 'W' from the second transfer robot 53, and performs the processing for the substrate 'W'. In addition, the process chamber 60 provides the substrate 'W', which has completely processed, to the second transfer robot 53. Mutually different processes may be performed in the process chambers 60, respectively.

Hereinafter, a substrate processing apparatus 1000 to perform a plasma process in the process chamber 60 will be described. In addition, the following description of the substrate processing apparatus 1000 will be made, by way of example, in that the substrate processing apparatus 1000 is configured to perform the plasma process for an edge area of a substrate in the process chamber 60. However, the inventive concept is not limited thereto, and the substrate processing apparatus 1000 to be described below may be identically or similarly applied to various chambers to perform the processing for a substrate. In addition, the substrate processing apparatus 1000 may be identically or similarly applied to various chambers to perform the plasma process for a substrate.

Figure 3:
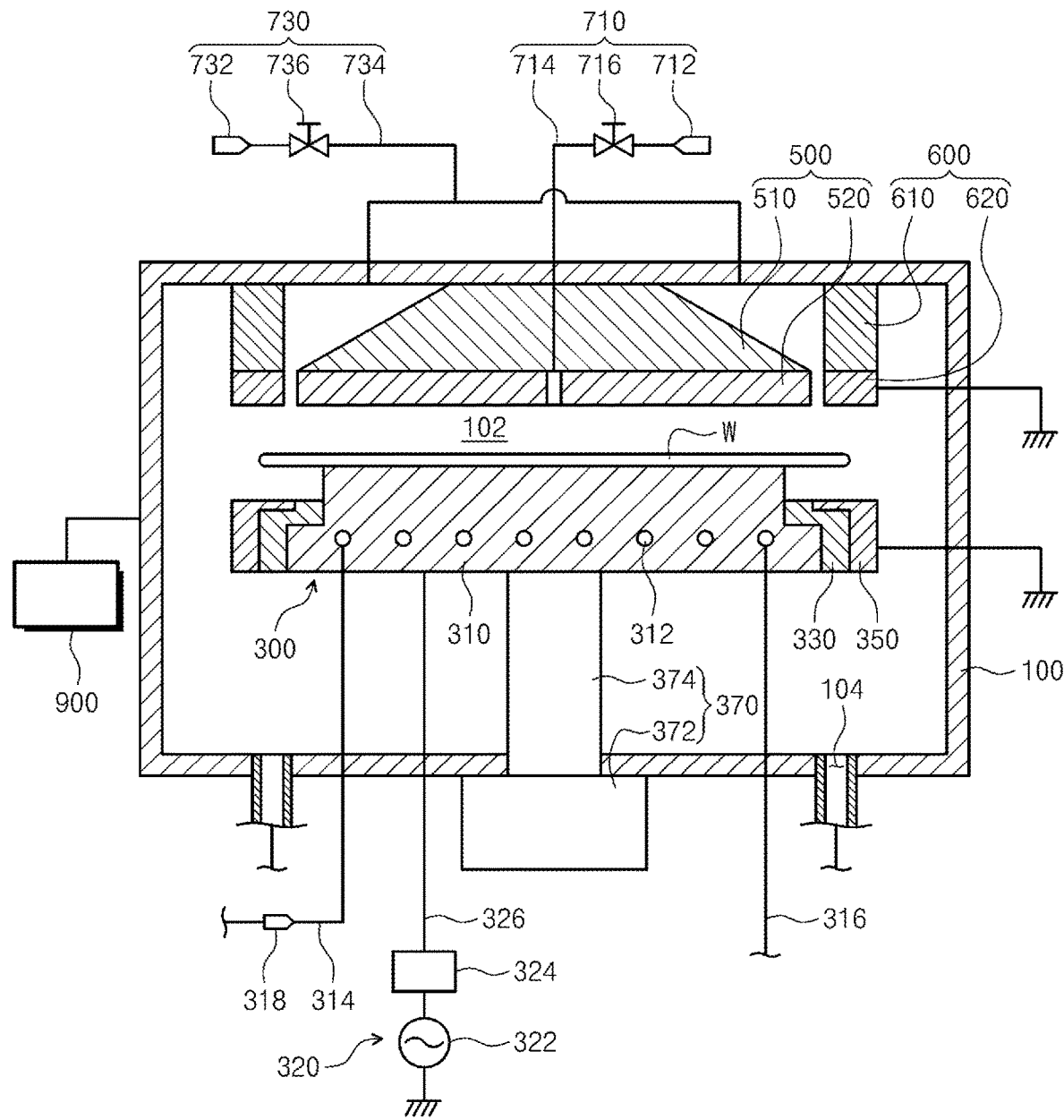
FIG. 3 is a view illustrating a substrate processing apparatus provided in a process chamber of FIG. 2, according to an embodiment.

FIG. 3 is a view illustrating a substrate processing apparatus provided in a process chamber of FIG. 2, according to an embodiment. Referring to FIG. 3, the substrate processing apparatus 1000 provided in the process chamber 60 performs a specific process on the substrate 'W' using plasma. For example, the substrate processing apparatus 1000 may etch or ash a film on the substrate 'W'. The film may include various types of films, such as a polysilicon film, a silicon oxide film, and a silicon nitride film. Further, the film may be a natural oxide film or an oxide film which is chemically produced. In addition, the film may be a by-product produced in processing the substrate. In addition, the film may be a foreign matter attached to and/or remaining on the substrate 'W'.

The substrate processing apparatus 1000 may perform a plasma process for the substrate 'W'. For example, the substrate processing apparatus 1000 may supply process gas, generate plasma from the supplied process gas, and process the substrate 'W'. For example, the substrate processing apparatus 1000 may supply process gas, generate plasma from the supplied process gas, and process an edge area of the substrate 'W'.

The substrate processing apparatus 1000 may include a housing 100, a support unit 300, a dielectric plate unit 500, an upper electrode unit 600, and a gas supply unit 700.

The housing 100 may have a process space 102 therein. The housing 100 may be formed in one surface thereof with an opening (not illustrated). The substrate 'W' may be introduced into or withdrawn out of the process space 102 of the housing 100 through the opening formed in the housing 100. The opening may be open or closed by an opening/closing member such as a door (not illustrated). When the opening of the housing 100 is open or closed by the opening/closing member, the process space 102 of the housing 100 may be isolated from the outside. In addition, the atmosphere of the process space 102 of the housing 100 may be adjusted to be at a lower pressure approximate to a vacuum state after the process space 102 of the housing 100 is isolated. In addition, the housing 100 may be formed of a material such as metal. In addition, the surface of the housing 100 may be coated with an insulating material.

In addition, a discharge hole 104 may be formed in a bottom surface of the housing 100. Plasma 'P' generated from the process space 102 or gas 'G1' and 'G2' supplied into the process space 102 may be discharged to the outside through the discharge hole 104. In addition, the by-product generated in processing the substrate 'W' using the plasma 'P' may be discharged to the outside through the discharge hole 104. In addition, the discharge hole 104 may be connected with a discharge line (not illustrated). The discharge line may be connected with a pressure reducing member to provide pressure reduction. The pressure reducing member may provide pressure reduction to the process space 102.

The support unit 300 may support the substrate 'W' in the process space 102. The support unit 300 may include a chuck 310, a power supply member 320, an insulating ring 330, a lower electrode 350, and a driving member 370.

The chuck 310 may have a support surface supporting the substrate 'W'. The chuck 310 may have a circular shape when viewed from the top. The chuck 310 may be stepped such that the height of the central area of the chuck 310 is higher than the height of the edge area of the chuck 310. Accordingly, the central area, which is supported by the chuck 310, of the substrate 'W' is seated on the support surface of the chuck 310, and the edge area of the substrate 'W' may not make contact with the support surface of the chuck 310.

A heating unit (not illustrated) may be provided inside the chuck 310. The heating unit (not illustrated) may heat the chuck 310. The heating unit may be a heater. In addition, a cooling fluid passage 312 may be formed in the chuck 310. The cooling fluid passage 312 may be formed inside the chuck 310. The cooling fluid passage 312 may be connected with a cooling fluid supply line 314 and a cooling fluid discharge line 316. The cooling fluid supply line 314 may be connected with a cooling fluid supply source 318. The cooling fluid supply source 318 may store a cooling fluid and/or may supply the cooling fluid to the cooling fluid supply line 314. In addition, the cooling fluid supplied to the cooling fluid passage 312 may be discharged to the outside through the cooling fluid discharge line 316. The cooling fluid stored by the cooling fluid supply source 318 and/or supplied from the cooling fluid supply source 318 may be a cooling water or cooling gas. The shape of the cooling fluid passage 312 formed in the chuck 310 is not limited to the shape illustrated in FIG. 3, but variously modified. In addition, a component to cool the chuck 310 is not limited to a component to supply the cooling fluid, but may include various components (for example, a cooling plate) that are able to the chuck 310.

The power supply member 320 may supply power to the chuck 310. The power supply member 320 may include a power source 322, a matcher 324, and a power line 326. The power source 322 may be a bias power supply. The power source 322 may be connected with the chuck 310 through the power line 326. In addition, the matcher 324 is provided on the power line 326 to perform impedance matching. The plasma generated from the process space 102 by the power supplied from the power source 322 may move toward the edge area of the substrate 'W'.

The insulating ring 330 may be provided in a ring shape when viewed from the top. The insulating ring 330 may be provided to surround the chuck 310, when viewed from the top. In addition, the insulating ring 330 may be provided to surround the stepped area of the chuck 310. For example, the insulating ring 330 may be provided to surround a lateral side of an edge part of the chuck 310, a top surface of the edge part of the chuck 310, and a portion of a lateral side of a central part of the chuck 310. The insulating ring 330 may have mutually different heights in inner and outer top surfaces thereof to be stepped. For example, the height of the inner top surface of the insulating ring 330 may be higher than the height of the outer top surface of the insulating ring. In addition, the insulating ring 330 may have mutually different heights in inner and outer bottom surfaces thereof to be stepped. For example, the height of the inner bottom surface of the insulating ring 330 may be higher than the height of the outer bottom surface of the insulating ring. In addition, the top surface of the insulating ring 330 may be provided to be spaced apart from the bottom surface of the substrate 'W' supported by the chuck 310. In detail, the top surface of the insulating ring 330 may be provided to be spaced apart from the bottom surface of the edge area of the substrate 'W' supported by the chuck 310. In addition, the top surface of the insulating ring 330 may be provided to be lower than the top surface of the central portion of the chuck 310.

The insulating ring 330 may be interposed between the chuck 310 and the lower electrode 350 to be described later. Since a bias power supply is provided in the chuck 310, the insulating ring 330 may be interposed between the chuck 310 and the lower electrode 350 to be described later. The insulating ring 330 may be formed of a material having an insulating property.

The lower electrode 350 may be disposed under the edge area of the substrate 'W' supported by the chuck 310. The lower electrode 350 may be provided in a ring shape when viewed from the top. The lower electrode 350 may be provided to surround the insulating ring 330 when viewed from the top. In addition, the lower electrode 350 may be provided to surround the stepped area of the insulating ring 330. The top surface of the lower electrode 350 may be provided in a flat shape. The height of the top surface of the lower electrode 350 may be equal to the inner top surface of the insulating ring 330. The lower electrode 350 may be stepped such that the height of the outer bottom surface of the lower electrode 350 is different from the height of the inner bottom surface of the lower electrode 350. For example, the height of the outer bottom surface of the lower electrode 350 may be lower than the height of the inner bottom surface of the lower electrode 350. In addition, the lower electrode 350 may be provided to be spaced apart from the bottom surface of the substrate 'W' supported by the chuck 310. For example, the lower electrode 350 may be provided to be spaced apart from the bottom surface of the edge area of the substrate 'W' supported by the chuck 310. In addition, the top surface of the lower electrode 350 may be provided to be lower than the top surface of the central part of the chuck 310.

The lower electrode 350 may be disposed to face an upper electrode 620 to be described later. The lower electrode 350 may be disposed to be under the upper electrode 620 to be described later. The lower electrode 350 may be grounded. The lower electrode 350 may increase the density of plasma by inducing coupling of bias power applied to the chuck 310. Accordingly, the processing efficiency for the edge area of the substrate 'W may be improved.

The driving member 370 may elevate the chuck 310. The driving member 370 may include a driver 372 and a shaft 374. The shaft 374 may be coupled to the chuck 310. The shaft 374 may be connected with the driver 372. The driver 372 may elevate the chuck 310 in the vertical direction through the shaft 374.

The dielectric plate unit 500 may include a dielectric plate 520 and a first base 510. The dielectric plate 520 may have a ring shape when viewed from the top. The dielectric plate 520 may be disposed to face the substrate 'W' supported by the support unit 300 in the process space 102. The dielectric plate 520 may be disposed on the support unit 300. The dielectric plate 520 may be formed of a material including ceramic. The dielectric plate 520 may have a fluid passage formed to be connected with a first gas supply part 710 of a gas supply unit 700 to be described later. In addition, a discharge end of the fluid passage may be configured such that the first gas 'G1' to be supplied by the first gas supply part 710 is supplied to the central area of the substrate 'W' supported by the support unit 300. In addition, the discharge end of the fluid passage may be configured such that the first gas 'G1' is supplied to the top surface of the central area of the substrate 'W' supported by the support unit 300.

A first base 510 may couple the dielectric plate 520 to the housing 100. The first base 510 may be provided in a flat shape on the top surface and the bottom surface thereof. In addition, the base 510 may be provided to have a diameter gradually reduced toward the bottom surface of the first base 510 from the top surface of the first base 510.

The upper electrode unit 600 may include a second base 610 and an upper electrode 620. The upper electrode 620 may face the lower electrode 350 described above. The upper electrode 620 may be disposed on the lower electrode 350. The upper electrode 620 may be provided on the edge area of the substrate 'W' supported by the chuck 310. The upper electrode 620 may be grounded.

The upper electrode 620 may have a shape to surround the dielectric plate 520 when viewed from the top. The upper electrode 620 may be provided to be spaced apart from the dielectric plate 520. The upper electrode 620 is spaced apart from the dielectric plate 520 to form a space. The space may serve as a channel allowing second gas 'G2', which is supplied by a second gas supply part 730, to flow. A discharge end of the channel may be configured such that the second gas G2' is supplied to the edge area of the substrate 'W' supported by the support unit 300. In addition, the discharge end of the channel may be configured such that the second gas 'G2' is supplied to the top surface of the edge area of the substrate 'W' supported by the support unit 300.

The second base 610 may couple the upper electrode 620 to the housing 100. The second base 610 may be provided in a ring shape. The second base 610 may be provided to surround the dielectric plate unit 500, when viewed from the top. The second base 610 may be provided to be spaced apart from the dielectric plate unit 500. The first base 510 may be combined with the second base 610 to form an inner space. The area of the inner space formed by combining the first base 510 with the second base 610 may be gradually reduced downward. In addition, the upper electrode 620 may be electrically connected with the second base 610, and the inner space may communicate with the above-described channel.

The gas supply unit 700 may supply gas into the process space 102. The gas supply unit 700 may supply the first gas 'G1' and the second gas 'G2' to the process space 102. The gas supply unit 700 may include a first gas supply part 710 and the second gas supply part 730.

The first gas supply part 710 may supply process gas into the process space 102. The first gas supply part 710 may supply the process gas to the central area of the substrate 'W' supported by the chuck 310. The first gas supply part 710 may include a first gas supply source 712, a first gas supply line 714, and a first valve 716. The first gas supply source 712 may store the first gas 'G1' and/or supply the first gas 'G1' to the first gas supply line 714. The first gas supply line 714 may be connected with the fluid passage formed in the dielectric plate 520. The first valve 716 may be installed on the first gas supply line 714. The first valve 716 may be an on/off valve or may be provided as a flow control valve. The process gas supplied by the first gas supply source 712 may be supplied to the central area of the top surface of the substrate 'W' through the fluid passage formed in the dielectric plate 520.

The second gas supply part 730 may supply the process gas to the process space 102. The second gas supply part 730 may supply the process gas through the space between the dielectric plate 520 and the upper electrode 620, which are provided on the edge area of the substrate 'W' supported by the chuck 310. The second gas supply part 730 may include a second gas supply source 732, a second gas supply line 734, and a second valve 736. The second gas supply source 732 may store the second gas 'G2' and/or may supply the second gas 'G2' to the second gas supply line 734. The second gas supply line 734 may supply the process gas to the space serving as the fluid channel formed as the upper electrode 620 is spaced apart from the dielectric plate 520. For example, the second gas supply line 734 may supply the process gas to the inner space formed by combining the first base 510 with the second base 610, and the process gas supplied to the inner space may be supplied to the space. The second valve 726 may be provided on the second gas supply line 734. The second valve 736 may be provided in the form of an on/off valve or a flow control valve. The process gas supplied by the second gas supply source 732 may be supplied to the edge area of the top surface of the substrate 'W' through the second fluid passage 602.

The first gas supply part 710 and the second gas supply part 730 may supply the first gas 'G1' and the second gas 'G2'. The first gas 'G1' and the second gas 'G2' may be in mutually different types. For example, the first gas supply part 710 may supply the first gas 'G1' or the second gas G2'. The second gas supply part 730 may supply the first gas G1' or the second gas G2'. In other words, the first gas supply part 710 and the second gas supply part 730 may supply gas in the same type or mutually different types.

The controller 900 may control the substrate processing apparatus 1000. The controller 900 may control the substrate processing apparatus 1000 to perform the plasma process to be performed later. For example, the controller 900 may control the gas supply unit 700 and the support unit 300. For example, the controller 900 may control the support unit 300 and the gas supply unit 700 such that the plasma 'P' is generated from the edge area of the substrate 'W' supported by the chuck 310 as the power source 322 supplies power to the chuck 310 when the process gas is supplied to the first gas supply part 710 and/or the second gas supply part 730.

Figure 4:
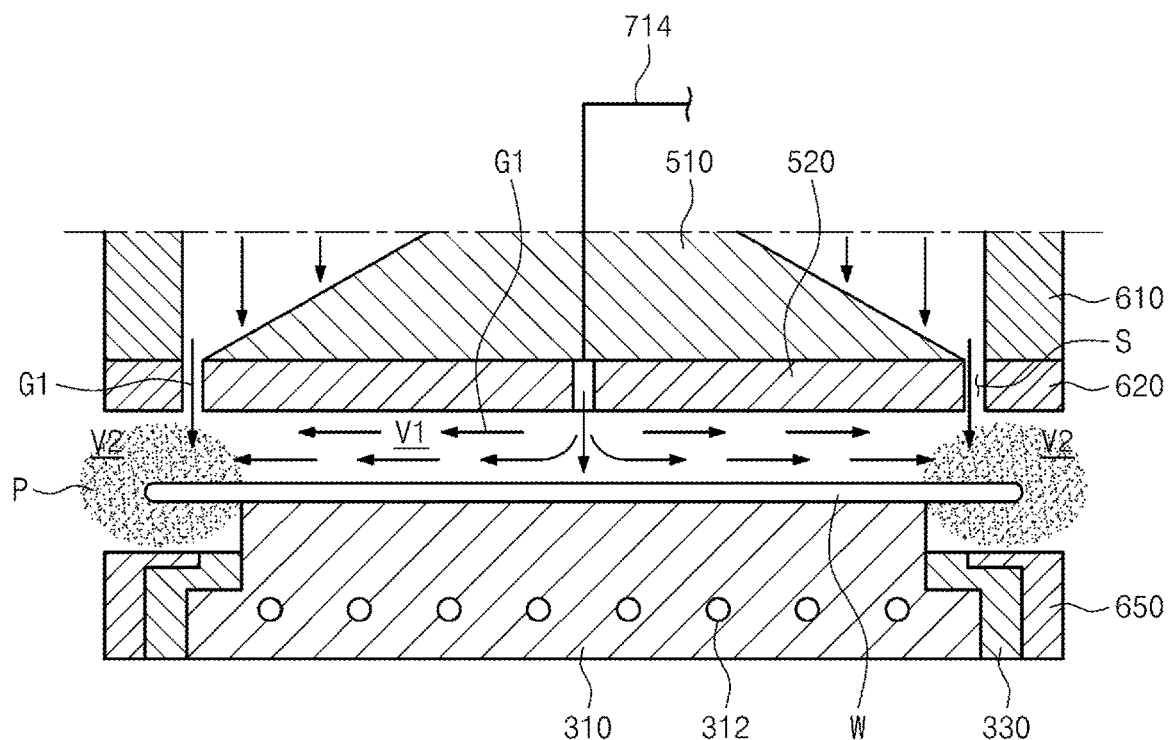
FIG. 4 is a view illustrating that the substrate processing apparatus of FIG. 3 performs a plasma process, according to an embodiment.

FIG. 4 is a view illustrating that the substrate processing apparatus of FIG. 3 performs a plasma process, according to an embodiment. Referring to FIG. 4, according to an embodiment of the inventive concept, the substrate processing apparatus 1000 may process the edge area of the substrate 'W'. For example, the substrate processing apparatus 1000 may process the edge area of the substrate 'W' by generating the plasma 'P' from the edge area of the substrate 'W'. For example, the substrate processing apparatus 1000 may perform a bevel etching process to process the edge area of the substrate 'W'. The substrate processing apparatus 1000 may allow the first gas supply part 710 to supply the first gas 'G1' to the central area of the substrate 'W and allow the second gas supply part 730 to supply the first gas 'G1' to the edge area of the substrate 'W', when processing the edge area of the substrate 'W'. In addition, the first gas 'G1' supplied by the first gas supply part 710 is in the same type as the type of the first gas 'G1' supplied by the second supply part 730, so the first gas 'G1' supplied by the first gas supply part 710 has the same molecular weight as that of the first gas 'G1' supplied by the second supply part 730.

In this case, the supply flow rate per unit time for the first gas 'G1' supplied to the central area of the substrate 'W' is greater than the supply flow rate per unit time for the first gas 'G1' supplied to the edge area of the substrate 'W'. Since the supply flow rate per unit time for the first gas 'G1' supplied to the central area of the substrate 'W' is greater than the supply flow rate per unit time for the first gas G1' supplied to the edge area of the substrate 'W', the first gas G1' substantially flows toward the edge area of the substrate 'W'.

In addition, as recognized from FIG. 4, regarding the volume of a space in which the first gas 'G1' supplied by the gas supply unit 700 flows, a volume 'V2' of the edge area of the substrate 'W' is provided to be greater than a volume 'V1' of the central area of the substrate 'W' supported by the chuck 310 when viewed from the top. The first gas 'G1' flowing toward the edge area of the substrate 'W' flows at a slower flow rate at the edge area of the substrate 'W'. In other words, since the time, in which the first gas G1' remains on the edge area of the substrate 'W', is increased, the efficiency of processing the edge region of the substrate 'W' is enhanced.

In addition, as described above, the first gas 'G1' is a process gas excited to be in a plasma state. Accordingly, the problems caused by mixing the inert gas and the process gas described above are not prevented.

Figure 5:
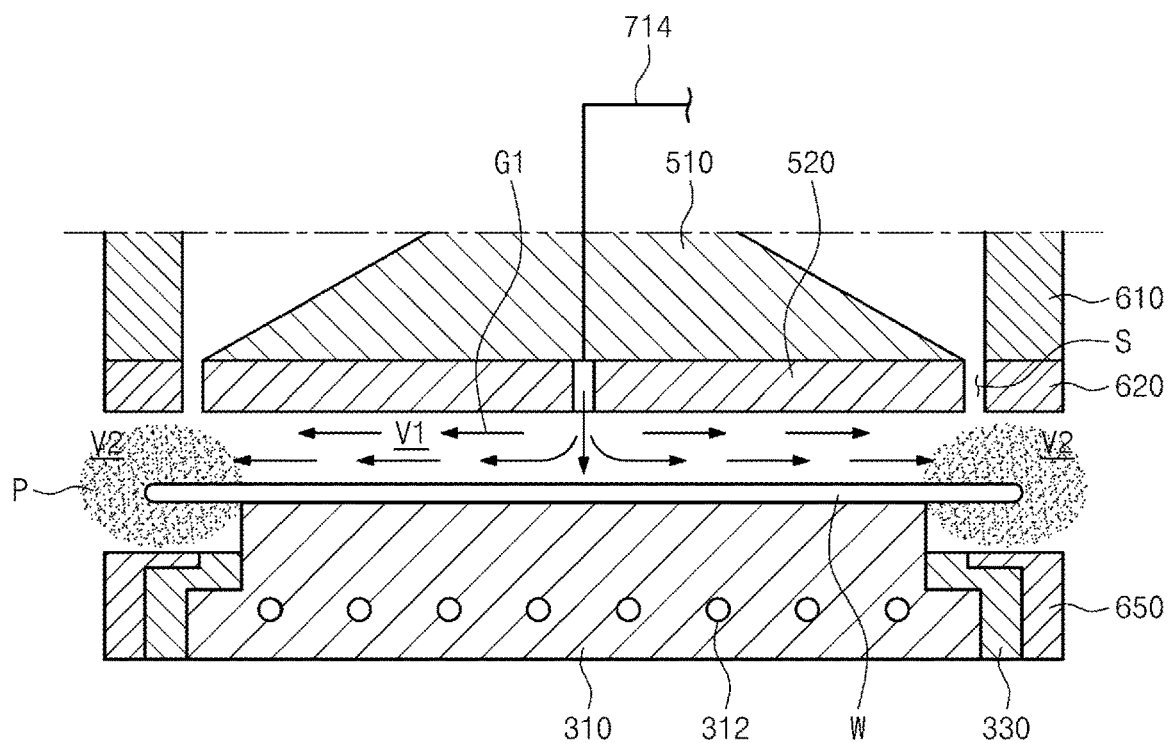
FIG. 5 is a view illustrating that the substrate processing apparatus of FIG. 3 performs a plasma process, according to another embodiment.

Although the above-described embodiment has been described in that the first gas supply part 710 and the second gas supply part 730 supply process gas when the edge area of the substrate 'W' supported by the chuck 310 is processed, the inventive concept is not limited thereto. For example, as illustrated in FIG. 5, when the edge area of the substrate 'W' supported by the chuck 310 is processed, the first gas G1' may be supplied only by the first gas supply part 710. The first gas 'G1' is supplied to the central area of the substrate 'W'. The first gas 'G1' supplied to the central area of the substrate 'W' flows to the edge area of the substrate 'W'. In the edge area of the substrate 'W', the volume V2 of the space in which the first gas 'G1' flows increases. Accordingly, the time in which the first gas 'G1' remains at the edge area of the substrate 'W' is increased, and the efficiency of processing the edge area of the substrate 'W' may be enhanced similarly to the above-described embodiment.

Figure 6:
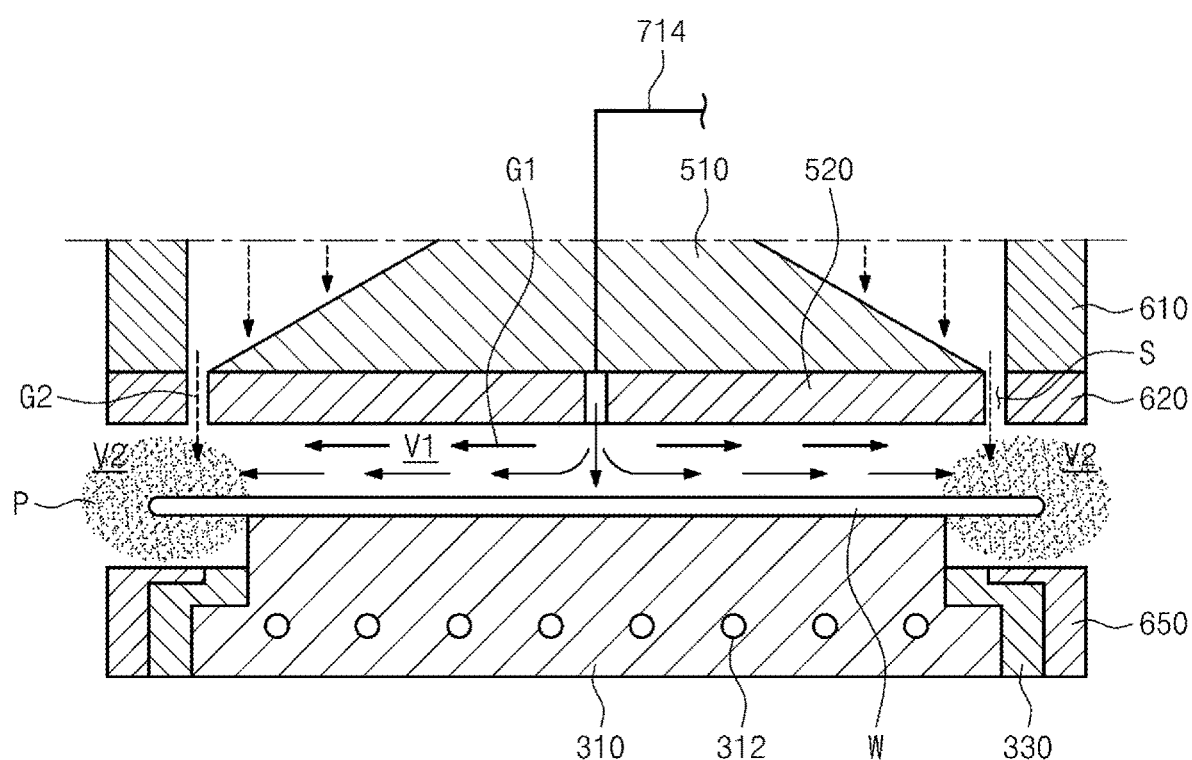
FIG. 6 is a view illustrating that the substrate processing apparatus of FIG. 3 performs a plasma process, according to another embodiment.

Although the above-described embodiment has been described in that the same type first gas 'G1' is supplied to the central area of the substrate 'W' and the edge area of the substrate 'W', the inventive concept is not limited thereto. For example, as illustrated in FIG. 6, the first gas 'G1' may be supplied to the central area of the substrate 'W' and the second gas 'G2' may be supplied to the edge area of the substrate 'W'. In this case, the total molecular weight per unit time for the first gas 'G1' supplied to the central area of the substrate 'W' is greater than the total molecular weight per unit time for the second gas 'G2' supplied to the edge area of the substrate 'W'. Accordingly, the first gas 'G1' and the second gas 'G2' may totally flow toward the edge area of the substrate 'W', and the efficiency of processing the edge area of the substrate 'W' may be enhanced similarly to the above-described embodiment and other embodiments.

Figure 7:
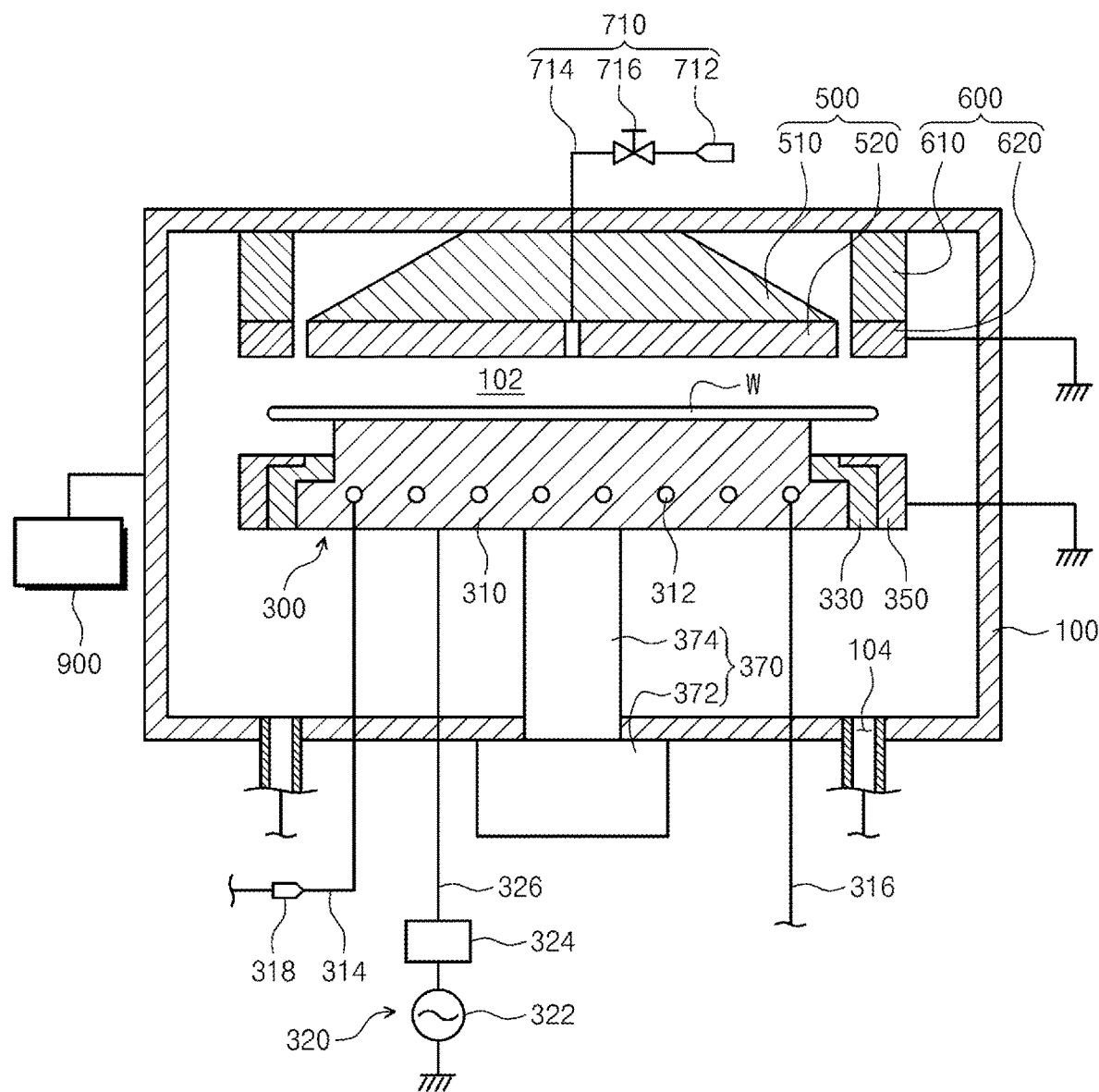
FIG. 7 is a view illustrating a substrate processing apparatus, according to another embodiment of the inventive concept.

Although the above-described embodiment has been described in that the gas supply unit 700 includes both the first gas supply part 710 and the second gas supply part 730, the inventive concept is not limited thereto. For example, as illustrated in FIG. 7, the gas supply unit 700 may include only the first gas supply part 710.

Although the above-described embodiments have been described in that the substrate processing apparatus 1000 performs the etching process with respect to the edge area of the substrate 'W', the inventive concept is not limited thereto. The fore-mentioned embodiments may be identically or similarly applied to various equipment and various processes requiring the processing for the edge area of the substrate 'W'.

A method for generating plasma in the substrate processing apparatus 1000, which has been described according to the above-described embodiments, may be an inductive coupled plasma (ICP) manner. In addition, the method for generating plasma in the substrate processing apparatus 1000 may be a capacitor couple plasma (CCP) manner. In addition, the substrate processing apparatus 1000 may generate the plasma 'P' by using both of the ICP manner and the CCP manner, or any one selected from the ICP manner and the CCP manner. In addition, the edge area of the substrate 'W' may be processed through a well-known manner for generating the plasma 'P' in addition to the above-described manner.

According to an embodiment of the inventive concept, the substrate may be efficiently processed.

In addition, according to an embodiment of the inventive concept, the plasma process for the substrate may be uniformly performed.

In addition, according to an embodiment of the inventive concept, the efficiency of the plasma process for the edge area of the substrate may be more enhanced.

The effects of the inventive concept are not limited to the above-described effects, and any other effects not mentioned herein will be clearly understood from the following description by those skilled in the art to which the inventive concept pertains.

The above description has been made for the illustrative purpose. Furthermore, the fore-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The fore-mentioned embodiment describes the best state for implementing the technical spirit of the inventive concept, and various changes required in the detailed application fields and purposes of the inventive concept can be made. Accordingly, the detailed description of the inventive concept is not intended to limit the inventive concept to the forms of the disclosed embodiments Furthermore, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate processing apparatus comprising:
   a housing having a process space;
   a support unit configured to support a substrate in the process space;
   a gas supply unit to supply process gas to the process space;
   a dielectric plate disposed to face the substrate supported by the support unit in the process space;
   an upper electrode spaced apart from the dielectric plate while surrounding the dielectric plate when viewed from a top; and
   a controller,
   wherein the support unit includes:
      a chuck having a support surface to support the substrate and connected with a power source; and
      a lower electrode disposed to face the upper electrode while surrounding the chuck when viewed from the top,
   wherein the gas supply unit includes:
      a first gas supply part configured to supply the process gas to a central area of the substrate supported by the chuck;
      a second gas supply part configured to supply the process gas through a space between the dielectric plate and the upper electrode which are provided on an edge area of the substrate supported by the chuck; and
      an insulating ring interposed between the chuck and the lower electrode,
   wherein the support unit, the dielectric plate, and the upper electrode are provided, such that a volume of a space, in which the process gas supplied by the gas supply unit flows, is larger in the edge area of the substrate supported by the chuck than the central area of the substrate supported by the chuck, when viewed from the top,
   wherein the controller is programmed to control the gas supply unit such that only the first gas supply part among the first gas supply part and the second gas supply part supplies the process gas, when processing the edge area of the substrate supported by the chuck,
   wherein the insulating ring is in direct contact with the chuck and the lower electrode, and includes a stepped portion on which the lower electrode penetrates into the insulating ring, such that, when viewed from the top, the lower electrode overlaps with the insulating ring in the stepped portion, and
   wherein the insulating ring and the lower electrode are spaced apart from a bottom surface of the edge area of the substrate supported by the chuck.

2. The substrate processing apparatus of claim 1, wherein an upper surface of the insulating ring is coplanar with an upper surface of the lower electrode.

3. The substrate processing apparatus of claim 1, wherein the controller is configured to:
   control the support unit and the gas supply unit such that the power source applies power to the chuck to generate plasma at the edge area of the substrate supported by the chuck when the first gas supply part and/or the second gas supply part supplies the process gas.

* * * * *